United States Patent
Funakoshi

(10) Patent No.: US 12,288,832 B2
(45) Date of Patent: Apr. 29, 2025

(54) METHOD FOR MANUFACTURING LIGHT-EMITTING ELEMENT

(71) Applicant: NICHIA CORPORATION, Anan (JP)

(72) Inventor: Ryota Funakoshi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 504 days.

(21) Appl. No.: 17/851,324

(22) Filed: Jun. 28, 2022

(65) Prior Publication Data

US 2023/0019698 A1    Jan. 19, 2023

(30) Foreign Application Priority Data

Jul. 14, 2021  (JP) ................. 2021-116174

(51) Int. Cl.
*H01L 33/00* (2010.01)
*H01L 33/02* (2010.01)
*H01L 33/06* (2010.01)
*H01L 33/38* (2010.01)

(52) U.S. Cl.
CPC ............ *H01L 33/06* (2013.01); *H01L 33/005* (2013.01); *H01L 33/025* (2013.01); *H01L 33/382* (2013.01); *H01L 2933/0016* (2013.01)

(58) Field of Classification Search
CPC ..... H01L 33/06; H01L 33/005; H01L 33/025; H01L 33/382; H01L 2933/0016
See application file for complete search history.

(56) References Cited

U.S. PATENT DOCUMENTS

| | | |
|---|---|---|
| 2004/0066816 A1 | 4/2004 | Collins et al. |
| 2009/0173961 A1 | 7/2009 | Windisch et al. |
| 2010/0224860 A1 | 9/2010 | Ibbetson et al. |
| 2013/0015465 A1 | 1/2013 | Lee |
| 2013/0270514 A1 | 10/2013 | Saxler |
| 2017/0338369 A1 | 11/2017 | Wildeson et al. |
| 2018/0047868 A1* | 2/2018 | David ............ H01L 33/025 |
| 2019/0140134 A1* | 5/2019 | Mann ............ H01L 33/14 |

(Continued)

FOREIGN PATENT DOCUMENTS

| | | |
|---|---|---|
| JP | 2004-128502 A | 4/2004 |
| JP | 2004-179369 A | 6/2004 |

(Continued)

*Primary Examiner* — Hoa B Trinh
(74) *Attorney, Agent, or Firm* — Foley & Lardner LLP

(57) ABSTRACT

A method for manufacturing a light-emitting element includes forming a first light-emitting part, forming a tunnel junction part on the first light-emitting part, and forming a second light-emitting part on the tunnel junction part. The step of forming the first light-emitting part includes forming a first layer with a first p-type impurity concentration at a first temperature, and forming a second layer with a second p-type impurity concentration on the first layer. The second p-type impurity concentration is greater than the first p-type impurity concentration. The step of forming the second light-emitting part includes forming a third layer with a third p-type impurity concentration at a second temperature and forming a fourth layer with a fourth p-type impurity concentration on the third layer. The fourth p-type impurity concentration is greater than the third p-type impurity concentration. The second temperature is less than the first temperature.

18 Claims, 6 Drawing Sheets

(56) References Cited

U.S. PATENT DOCUMENTS

2019/0207043 A1* 7/2019 Yonkee ............ H01L 21/02579
2021/0202790 A1   7/2021 Hayashi

FOREIGN PATENT DOCUMENTS

| | | |
|---|---|---|
| JP | 2005-136162 A | 5/2005 |
| JP | 2007-095823 A | 4/2007 |
| JP | 2008-078297 A | 4/2008 |
| JP | 2009-522755 A | 6/2009 |
| JP | 2009-527920 A | 7/2009 |
| JP | 2013-021334 A1 | 1/2013 |
| JP | 2019-522356 A | 8/2019 |
| JP | 2021-502713 A | 1/2021 |

* cited by examiner

METHOD FOR MANUFACTURING LIGHT-EMITTING ELEMENT

CROSS-REFERENCE TO RELATED APPLICATIONS

This application is based upon and claims priority to Japanese Patent Application No. 2021-116174, filed on Jul. 14, 2021, the entire contents of which are incorporated herein by reference.

FIELD

The present disclosure relates to a method for manufacturing a light-emitting element.

BACKGROUND

Japanese Patent Application No. 2004-128502 describes, for example, a light-emitting element that includes: a first light-emitting part that includes a first n-type layer, a first active layer, and a first p-type layer; a tunnel junction layer located on the first light-emitting part; and a second light-emitting part that is located on the tunnel junction layer and includes a second n-type layer, a second active layer, and a second p-type layer.

SUMMARY

According to one aspect of the present invention, a method for manufacturing a light-emitting element includes forming a first light-emitting part, forming a tunnel junction part on the first light-emitting part; and forming a second light-emitting part on the tunnel junction part. The first light-emitting part includes a first n-type semiconductor layer, a first active layer located on the first n-type semiconductor layer, and a first p-type semiconductor layer located on the first active layer.

The second light-emitting part includes a second n-type semiconductor layer, a second active layer located on the second n-type semiconductor layer, and a second p-type semiconductor layer located on the second active layer. The first p-type semiconductor layer includes a first layer and a second layer. The forming of the first light-emitting part includes forming the first layer with a first p-type impurity concentration at a first temperature, and forming the second layer with a second p-type impurity concentration on the first layer. The second p-type impurity concentration is greater than the first p-type impurity concentration. The second p-type semiconductor layer includes a third layer and a fourth layer. The forming of the second light-emitting part includes forming the third layer with a third p-type impurity concentration at a second temperature and forming the fourth layer with a fourth p-type impurity concentration on the third layer. The fourth p-type impurity concentration is greater than the third p-type impurity concentration. The second temperature is less than the first temperature.

DETAILED DESCRIPTION

Figure 1:
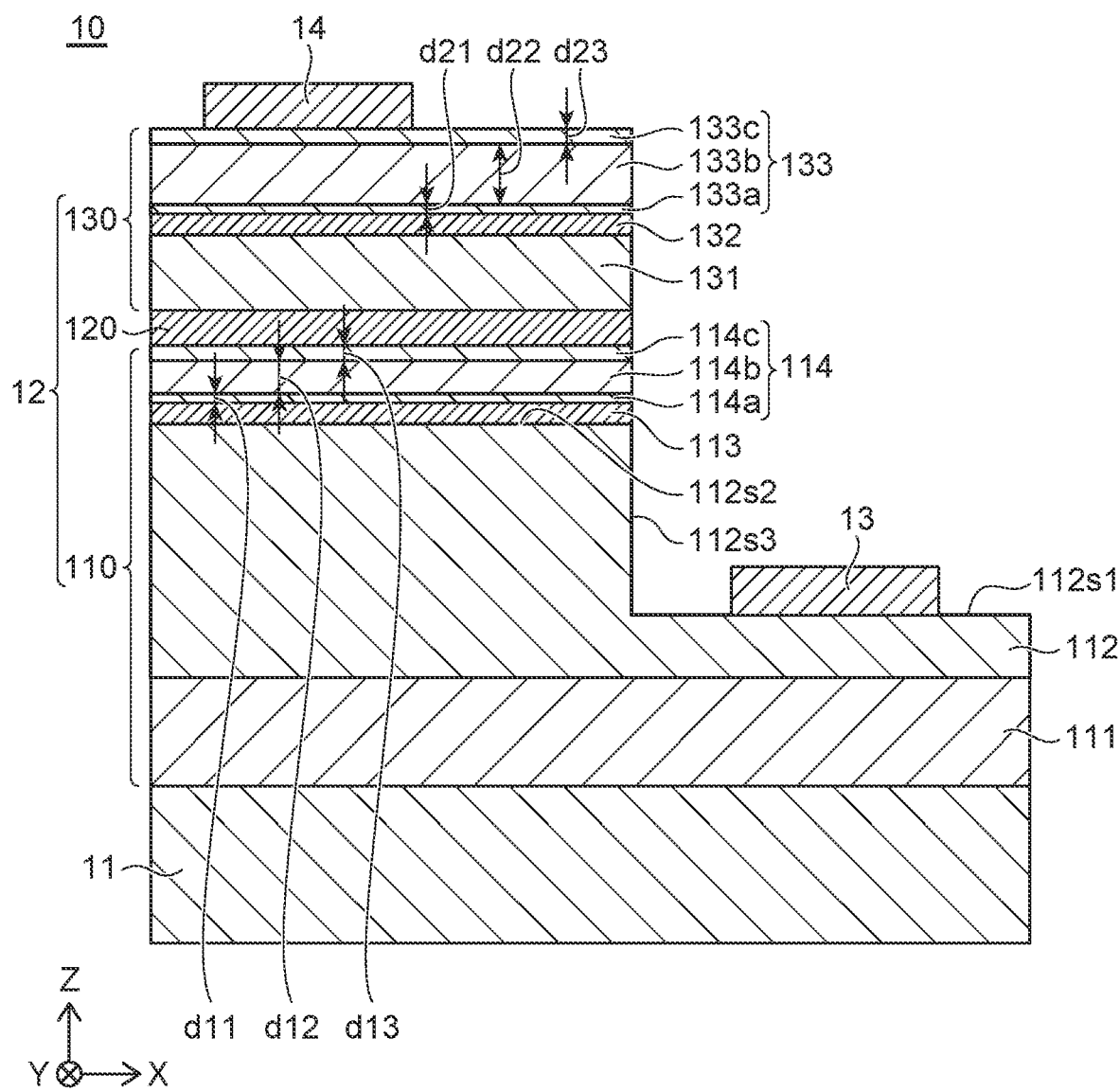
FIG. 1 is a cross-sectional view showing a light-emitting element according to an embodiment.

Exemplary embodiments will now be described with reference to the drawings. The drawings are schematic or conceptual, and the relationships between the thickness and width of portions, the proportional coefficients of sizes among portions, etc., are not necessarily the same as the actual values thereof. Furthermore, the dimensions and proportions of elements may be illustrated differently among drawings, even for identical elements. In the specification of the application and the drawings, components similar to those described in regard to a previous drawing are marked with similar reference numerals, and a repeated detailed description is omitted as appropriate.

For easier understanding of the following description, the arrangements and configurations of the portions are described using an XYZ orthogonal coordinate system. An X-axis, a Y-axis, and a Z-axis are orthogonal to each other. The direction in which the X-axis extends is taken as an "X-direction", the direction in which the Y-axis extends is taken as a "Y-direction", and the direction in which the Z-axis extends is taken as a "Z-direction." Although the Z-direction is taken as up and the opposite direction is taken as down for easier understanding of the description, these directions are independent of the direction of gravity.

FIG. 1 is a cross-sectional view showing a light-emitting element according to an embodiment.

The light-emitting element 10 according to this embodiment includes a substrate 11, a semiconductor stacked body 12, an n-side electrode 13, and a p-side electrode 14. The components of the light-emitting element 10 will now be elaborated.

According to this embodiment, the substrate 11 has a flat plate shape. The upper surface and the lower surface of the substrate 11 are substantially parallel to the XY plane. However, multiple protrusions may be formed in the upper surface of the substrate. Although not particularly limited, for example, sapphire ($Al_2O_3$), silicon (Si), silicon carbide (SiC), gallium nitride (GaN), etc., are examples of the material of the substrate 11. According to the present embodiment, the substrate 11 is made of sapphire.

The semiconductor stacked body 12 is located on the substrate 11.

The semiconductor stacked body 12 is, for example, a stacked body in which multiple semiconductor layers made of nitride semiconductors are stacked. Here, "nitride semiconductor" includes all compositions of semiconductors for which the composition ratios x and y of the chemical formula $In_xAl_yGa_{1-x-y}N$ (0≤x≤1, 0≤y≤1, and x+y≤1) are changed within the ranges respectively.

The semiconductor stacked body 12 includes a first light-emitting part 110, a tunnel junction part 120, and a second light-emitting part 130. Generally speaking, the first light-emitting part 110 includes a first n-type semiconductor layer 112, a first active layer 113, and a first p-type semiconductor layer 114. The first light-emitting part 110 may further include a foundation layer 111. The first p-type semiconductor layer 114 includes a first layer 114b and a second layer 114c. Generally speaking, the second light-emitting part 130 includes a second n-type semiconductor layer 131, a second active layer 132, and a second p-type semiconductor layer 133. The second p-type semiconductor layer 133 includes a third layer 133b and a fourth layer 133c. The first p-type semiconductor layer 114 may further include a fifth layer 114a. The second p-type semiconductor layer 133 may further include a sixth layer 133a. The components will now be elaborated.

The foundation layer 111 of the first light-emitting part 110 is located on the substrate 11. The foundation layer 111 includes, for example, an undoped semiconductor layer. In the specification, "undoped" means that an n-type impurity and/or a p-type impurity is not intentionally doped. The term "n-type impurity" means an impurity that forms donors. The term "p-type impurity" means an impurity that forms acceptors. There are cases in which an undoped semiconductor layer that is adjacent to a layer intentionally doped with an n-type impurity and/or a p-type impurity includes the n-type impurity and/or the p-type impurity due to diffusion from the adjacent layer, etc. The undoped semiconductor layer is a semiconductor layer formed without supplying a source gas that includes an n-type impurity and/or a p-type impurity.

The undoped semiconductor layer of the foundation layer 111 includes, for example, gallium nitride (GaN).

The first n-type semiconductor layer 112 is located on the foundation layer 111. However, the first n-type semiconductor layer may be directly located on the substrate without including the foundation layer in the first light-emitting part.

The first n-type semiconductor layer 112 includes one or more n-type semiconductor layers. The n-type semiconductor layer of the first n-type semiconductor layer 112 includes, for example, GaN doped with silicon (Si) as the n-type impurity. The n-type semiconductor layers of the first n-type semiconductor layer 112 may further include indium (In), aluminum (Al), etc.

The first n-type semiconductor layer 112 may further include one or more undoped semiconductor layers. The undoped semiconductor layers of the first n-type semiconductor layer 112 include, for example, GaN.

The upper surface of the first n-type semiconductor layer 112 includes a first surface 112s1, a second surface 112s2, and a third surface 112s3. The first surface 112s1 is substantially parallel to the X-Y plane. The second surface 112s2 is positioned higher than the first surface 112s1 and is substantially parallel to the X-Y plane. The second surface 112s2 is next to the first surface 112s1 in the X-direction in a top-view. The third surface 112s3 is positioned between the first surface 112s1 and the second surface 112s2 and is substantially parallel to the Y-Z plane.

The first active layer 113 is located on the second surface 112s2. However, the shape of the upper surface of the first n-type semiconductor layer is not limited to the shapes described above.

The first active layer 113 includes, for example, a multi-quantum well structure that includes multiple well layers and multiple barrier layers. The multiple well layers can include, for example, indium gallium nitride (InGaN). The multiple barrier layers can include, for example, GaN. The well layer and the barrier layer may be, for example, undoped semiconductor layers. An n-type impurity and/or a p-type impurity may be included in at least portions of the well layer and the barrier layer.

The first p-type semiconductor layer 114 is located on the first active layer 113.

According to this embodiment, the first p-type semiconductor layer 114 includes the fifth layer 114a, the first layer 114b, and the second layer 114c in this order from the first active layer 113 side.

The fifth layer 114a is located on the first active layer 113. The fifth layer 114a includes, for example, aluminum gallium nitride (AlGaN) doped with magnesium (Mg) as the p-type impurity.

The first layer 114b is located on the fifth layer 114a. The first layer 114b is a semiconductor layer having a first p-type impurity concentration. The first layer 114b includes, for example, undoped GaN. By the first p-type semiconductor layer 114 including the undoped first layer 114b, the electrostatic breakdown voltage characteristics of the light-emitting element 10 can be improved compared to when the first layer 114b is a semiconductor layer that includes a p-type impurity. The first p-type impurity concentration can be, for example, not less than $1 \times 10^{19}/cm^3$ and not more than $5 \times 10^{19}/cm^3$.

The second layer 114c is located on the first layer 114b. The second layer 114c is a semiconductor layer having a second p-type impurity concentration that is greater than the first p-type impurity concentration. The second layer 114c includes, for example, GaN doped with Mg as the p-type impurity. The tunnel junction part 120 is located on the second layer 114c. The second p-type impurity concentration can be, for example, not less than $5 \times 10^{19}/cm^3$ and not more than $1 \times 10^{21}/cm^3$.

Although the fifth layer 114a and the second layer 114c are intentionally doped with a p-type impurity, the first layer 114b is not intentionally doped with a p-type impurity. Therefore, the p-type impurity concentrations of the fifth layer 114a and the second layer 114c are greater than the impurity concentration of the first layer 114b. Also, the first layer 114b may include a p-type impurity due to the p-type impurities of the fifth and second layers 114a and 114c diffusing into the first layer 114b.

A film thickness d12 of the first layer 114b is greater than a film thickness d13 of the second layer 114c. The film thickness d13 of the second layer 114c is greater than a film thickness d11 of the fifth layer 114a. In other words, film thickness d12>film thickness d13>film thickness d11. However, the magnitude relationship of the film thicknesses of the fifth layer 114a, the first layer 114b, and the second layer 114c is not limited to the relationship described above. The film thickness d12 of the first layer 114b can be, for example, not less than 30 nm and not more than 70 nm. The film thickness d13 of the second layer 114c can be, for example, not less than 10 nm and not more than 30 nm. The film thickness d11 of the fifth layer 114a can be, for example, not less than 5 nm and not more than 25 nm.

A configuration is described above in which the first p-type semiconductor layer 114 includes the fifth layer 114a, the first layer 114b, and the second layer 114c. However, the configuration of the first p-type semiconductor layer is not limited to the configuration described above as long as the first p-type semiconductor layer includes the first and second layers.

The tunnel junction part 120 includes an n-type impurity and/or a p-type impurity. Specifically, the tunnel junction part 120 includes at least one of a p-type semiconductor layer that has a higher p-type impurity concentration than the semiconductor layer having the highest p-type impurity concentration among the semiconductor layers included in the first p-type semiconductor layer 114, or an n-type semiconductor layer that includes a higher n-type impurity concentration than the semiconductor layer having the highest n-type impurity concentration among the semiconductor layers included in a second n-type semiconductor layer 131 described below. When a p-type semiconductor layer is included in the tunnel junction part 120, the p-type semiconductor layer includes, for example, GaN doped with Mg as the p-type impurity. When an n-type semiconductor layer is included in the tunnel junction part 120, the n-type semiconductor layer includes, for example, GaN doped with Si as the n-type impurity. According to this embodiment, the tunnel junction part 120 includes GaN doped with Si as the n-type impurity.

The second light-emitting part 130 is located on the tunnel junction part 120.

The second light-emitting part 130 includes the second n-type semiconductor layer 131, the second active layer 132, and the second p-type semiconductor layer 133.

The second n-type semiconductor layer 131 is located on the tunnel junction part 120. The second n-type semiconductor layer 131 includes one or more n-type semiconductor layers. The n-type semiconductor layers of the second n-type semiconductor layer 131 include, for example, GaN doped with Si as the n-type impurity. The n-type semiconductor layers of the second n-type semiconductor layer 131 may further include In, Al, etc.

The second n-type semiconductor layer 131 may further include one or more undoped semiconductor layers. Although the undoped semiconductor layers of the second n-type semiconductor layer 131 are not particularly limited, the undoped semiconductor layers include, for example, GaN.

The second active layer 132 is located on the second n-type semiconductor layer 131.

The second active layer 132 includes, for example, a multi-quantum well structure that includes multiple well layers and multiple barrier layers. The multiple well layers can include, for example, InGaN. The multiple barrier layers can include, for example, GaN. The well layer and the barrier layer may be, for example, undoped semiconductor layers. An n-type impurity and/or a p-type impurity may be included in at least portions of the well layer and the barrier layer.

The light that is emitted by the first and second active layers 113 and 132 is, for example, ultraviolet light or visible light. The light emission peak wavelength of the first active layer 113 and the light emission peak wavelength of the second active layer 132 may be different. Specifically, for example, the first active layer 113 may emit blue light, and the second active layer 132 may emit green light. The light emission peak wavelength of the blue light is, for example, not less than 430 nm and not more than 490 nm. The light emission peak wavelength of the green light is, for example, not less than 500 nm and not more than 540 nm.

The second p-type semiconductor layer 133 is located on the second active layer 132.

According to this embodiment, the second p-type semiconductor layer 133 includes the sixth layer 133a, the third layer 133b, and the fourth layer 133c in this order from the second active layer 132 side.

The sixth layer 133a is located on the second active layer 132. The sixth layer 133a includes, for example, AlGaN doped with Mg as the p-type impurity.

The third layer 133b is located on the sixth layer 133a. The third layer 133b is a semiconductor layer that has a third p-type impurity concentration. The third layer 133b includes, for example, undoped GaN. By the second p-type semiconductor layer 133 including the undoped third layer 133b, the electrostatic breakdown voltage characteristics of the light-emitting element 10 can be improved compared to when the third layer 133b is a semiconductor layer that includes a p-type impurity. The third p-type impurity concentration can be, for example, not less than $1 \times 10^{19}/cm^3$ and not more than $5 \times 10^{19}/cm^3$.

The fourth layer 133c is located on the third layer 133b. The fourth layer 133c is a semiconductor layer having a fourth p-type impurity concentration that is greater than the third p-type impurity concentration. The fourth layer 133c includes, for example, GaN doped with Mg as the p-type impurity. It is favorable for the fourth p-type impurity concentration to be less than the second p-type impurity concentration. The fourth p-type impurity concentration can be, for example, not less than $3 \times 10^{19}/cm^3$ and not more than $1 \times 10^{21}/cm^3$.

A film thickness d22 of the third layer 133b is greater than a film thickness d23 of the fourth layer 133c. The film thickness d23 of the fourth layer 133c is greater than a film thickness d21 of the sixth layer 133a. However, the magnitude relationship of the film thicknesses of the third, fourth, and sixth layers is not limited to the relationship described above. The film thickness d22 of the third layer 133b can be, for example, not less than 70 nm and not more than 110 nm. The film thickness d23 of the fourth layer 133c can be, for example, not less than 10 nm and not more than 30 nm. The film thickness d21 of the sixth layer 133a can be, for example, not less than 5 nm and not more than 25 nm.

The film thickness d21 of the sixth layer 133a is substantially equal to the film thickness d11 of the fifth layer 114a.

The film thickness d22 of the third layer 133b is greater than the film thickness d12 of the first layer 114b. In such a case, it is favorable for the film thickness d22 to be not less than 1.5 times and not more than 3 times the film thickness d12.

The film thickness d23 of the fourth layer 133c is substantially equal to the film thickness d13 of the second layer 114c. In summary, it is favorable for film thickness d11=film thickness d21<film thickness d13=film thickness d23<film thickness d12<film thickness d22. However, the magnitude relationship of these film thicknesses is not limited to such a relationship.

A configuration is described above in which the second p-type semiconductor layer 133 includes the sixth layer 133a, the third layer 133b, and the fourth layer 133c. However, the second p-type semiconductor layer 133 is not limited to the configuration described above as long as the second p-type semiconductor layer 133 includes the third and fourth layers.

The n-side electrode 13 is located on a first surface 112s1 of the first n-type semiconductor layer 112. The n-side electrode 13 is electrically connected to the first n-type semiconductor layer 112. The p-side electrode 14 is located on the fourth layer 133c of the second p-type semiconductor layer 133. The p-side electrode 14 is electrically connected to the second p-type semiconductor layer 133.

A method for manufacturing the light-emitting element 10 according to an embodiment will now be described.

Figure 2:
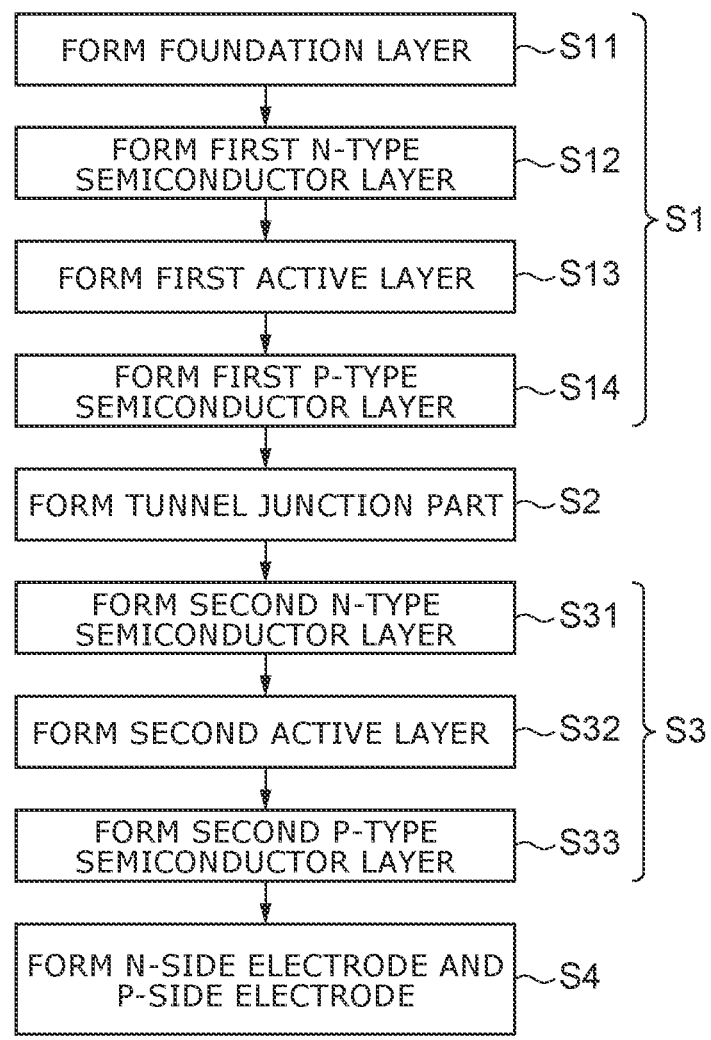
FIG. 2 is a flowchart showing a method for manufacturing the light-emitting element according to the embodiment.

FIG. 2 is a flowchart showing the method for manufacturing the light-emitting element according to this embodiment.

Figure 3A:
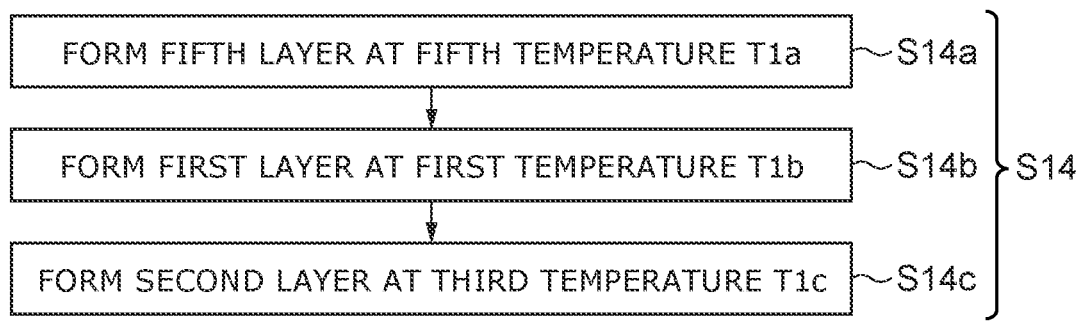
FIG. 3A is a flowchart showing details of a process of forming a first p-type semiconductor layer of FIG. 2.

FIG. 3A is a flowchart showing details of the process of forming the first p-type semiconductor layer of FIG. 2.

Figure 3B:
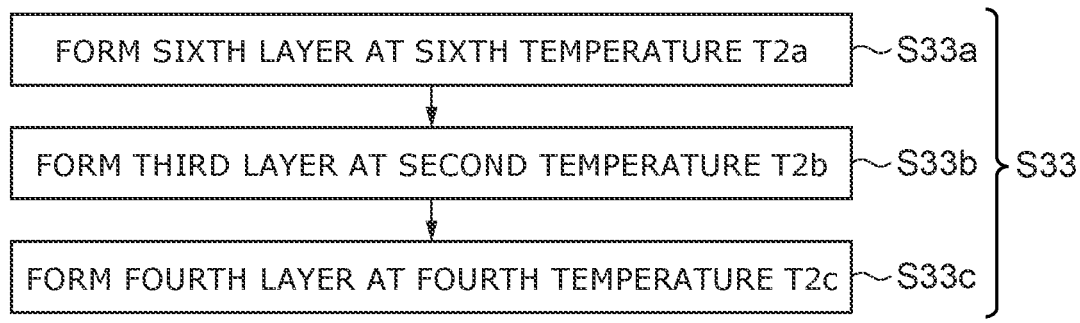
FIG. 3B is a flowchart showing details of a process of forming a second p-type semiconductor layer of FIG. 2.

FIG. 3B is a flowchart showing details of the process of forming the second p-type semiconductor layer of FIG. 2.

Figure 4:
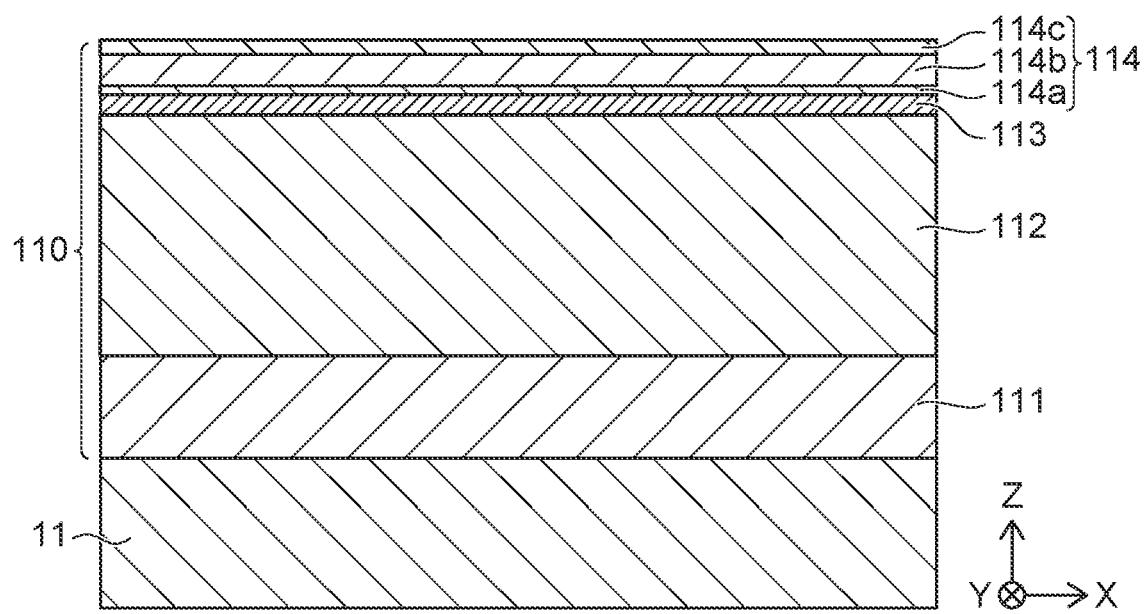
FIG. 4 is a cross-sectional view of a first light-emitting part obtained by a process of forming the first light-emitting part according to the method for manufacturing the light-emitting element according to the embodiment.

FIG. 4 is a cross-sectional view of the first light-emitting part obtained by the process of forming the first light-emitting part according to the method for manufacturing the light-emitting element according to this embodiment.

Figure 5:
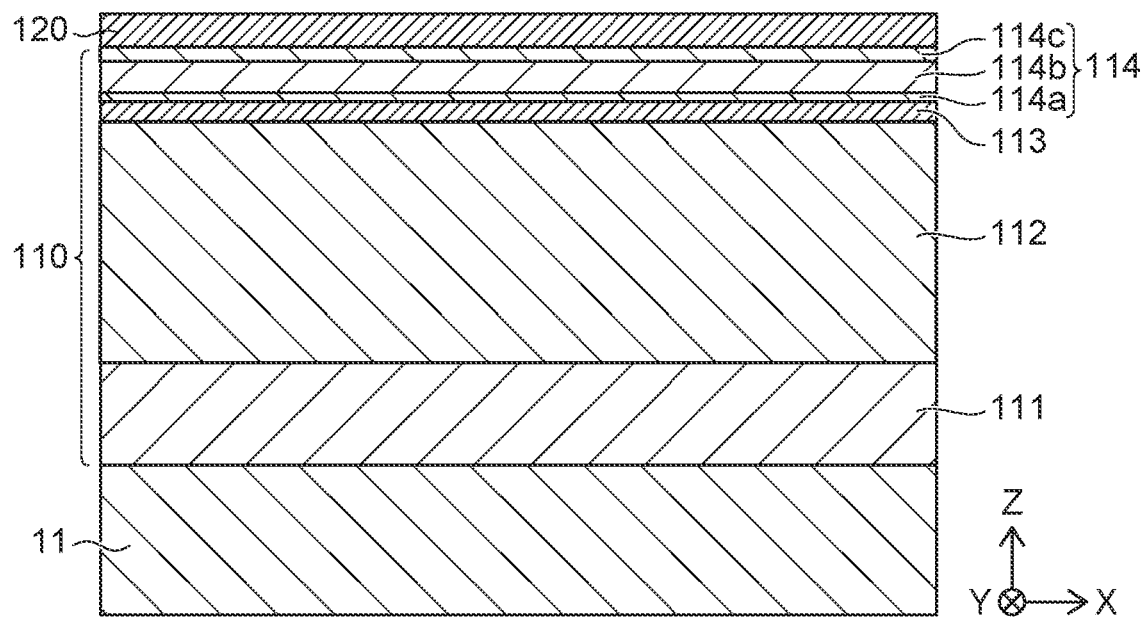
FIG. 5 is a cross-sectional view for describing a tunnel junction part obtained by a process of forming the tunnel junction part according to the method for manufacturing the light-emitting element according to the embodiment.

FIG. 5 is a cross-sectional view for describing the tunnel junction part obtained by the process of forming the tunnel junction part according to the method for manufacturing the light-emitting element according to this embodiment.

Figure 6:
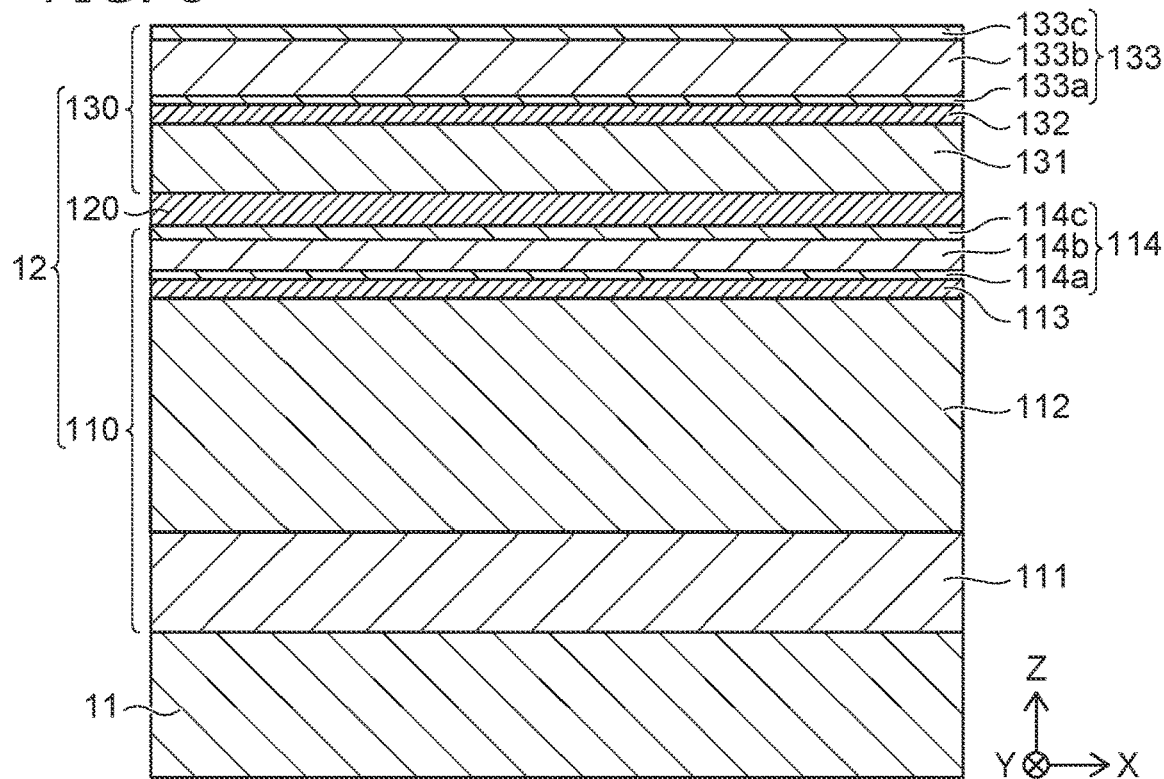
FIG. 6 is a cross-sectional view for describing a second light-emitting part obtained by a process of forming the second light-emitting part according to the method for manufacturing the light-emitting element according to the embodiment.

FIG. 6 is a cross-sectional view for describing the second light-emitting part obtained by the process of forming the second light-emitting part according to the method for manufacturing the light-emitting element according to this embodiment.

Figure 7:
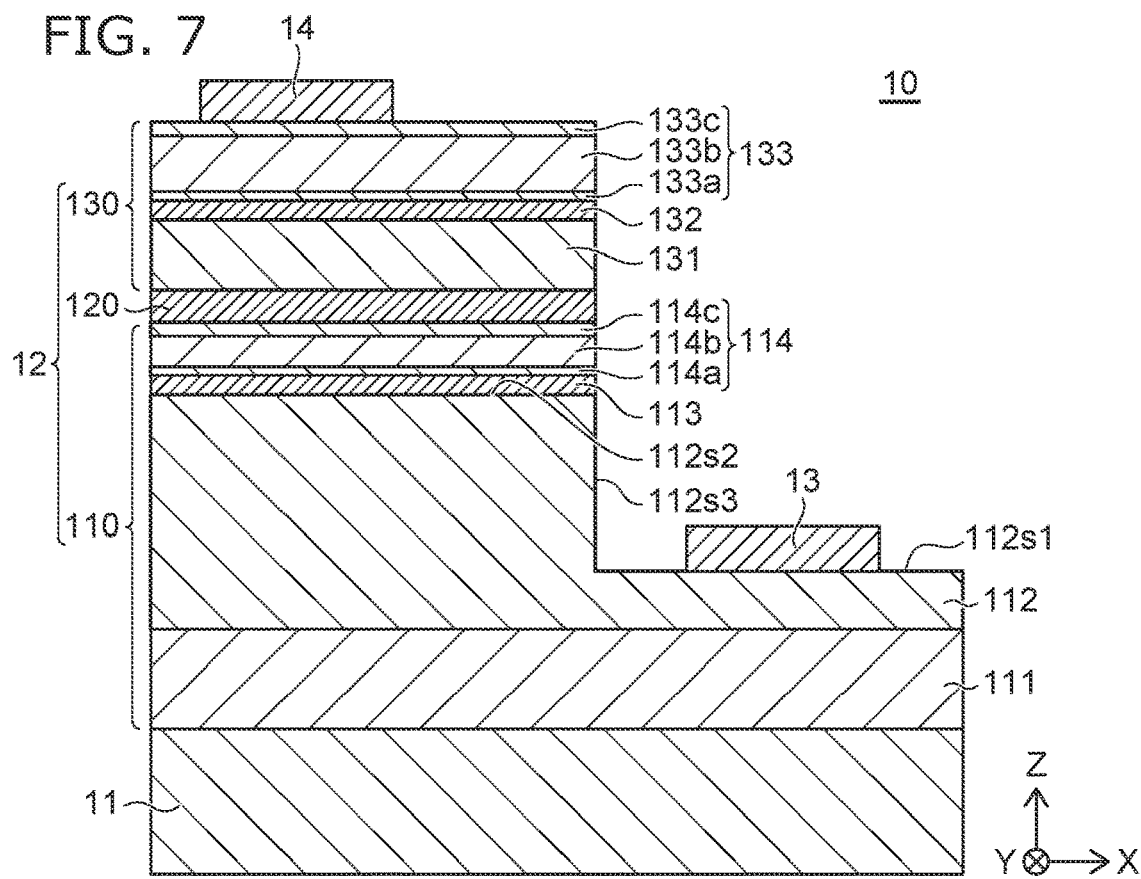
FIG. 7 is a cross-sectional view for describing a n-side electrode and a p-side electrode obtained by a process of forming the n-side electrode and the p-side electrode according to the method for manufacturing the light-emitting element according to the embodiment.

FIG. 7 is a cross-sectional view for describing the n-side electrode and the p-side electrode obtained by the process of forming the n-side electrode and the p-side electrode according to the method for manufacturing the light-emitting element according to this embodiment.

Generally speaking, as shown in FIG. 2, the method for manufacturing the light-emitting element 10 according to this embodiment includes a process S1 of forming the first light-emitting part 110, a process S2 of forming the tunnel junction part 120, a process S3 of forming the second light-emitting part 130, and a process S4 of forming the n-side electrode 13 and the p-side electrode 14. The process S1 of forming the first light-emitting part 110 includes a process S12 of forming the first n-type semiconductor layer 112, a process S13 of forming the first active layer 113, and a process S14 of forming the first p-type semiconductor layer 114. The process S1 of forming the first light-emitting part 110 may further include a process S11 of forming the foundation layer 111. The process S3 of forming the second light-emitting part 130 includes a process S31 of forming the second n-type semiconductor layer 131, a process S32 of forming the second active layer 132, and a process S33 of forming the second p-type semiconductor layer 133.

As shown in FIG. 3A, the process S14 of forming the first p-type semiconductor layer 114 includes a process S14b of forming the first layer 114b and a process S14c of forming the second layer 114c. The process S14 of forming the first p-type semiconductor layer 114 may further include a process S14a of forming the fifth layer 114a. As shown in FIG. 3B, the process S33 of forming the second p-type semiconductor layer 133 includes a process S33b of forming the third layer 133b and a process S33c of forming the fourth layer 133c. The process S33 of forming the second p-type semiconductor layer 133 may further include a process S33a of forming the sixth layer 133a.

Hereinbelow, a temperature T1b when forming the first layer 114b is called a "first temperature T1b." A temperature T2b when forming the third layer 133b is called a "second temperature T2b." A temperature T1c when forming the second layer 114c is called a "third temperature T1c." A temperature T2c when forming the fourth layer 133c is called a "fourth temperature T2c." A temperature T1a when forming the fifth layer 114a is called a "fifth temperature T1a." A temperature T2a when forming the sixth layer 133a is called a "sixth temperature T2a." In the specification, "temperature" is a temperature measured by a thermocouple located at the vicinity of the substrate 11.

For example, the first light-emitting part 110, the tunnel junction part 120, and the second light-emitting part 130 included in the semiconductor stacked body 12 are formed by MOCVD (metal organic chemical vapor deposition) in a furnace in which the pressure and the temperature can be regulated. Specifically, the semiconductor stacked body 12 is formed by supplying a carrier gas and a source gas to the furnace.

For example, hydrogen ($H_2$) gas, nitrogen ($N_2$) gas, etc., can be used as the carrier gas.

The source gas is selected as appropriate according to the semiconductor layer to be formed. When a semiconductor layer that includes Ga is formed, for example, a source gas that includes Ga such as trimethylgallium (TMG) gas, triethylgallium (TEG) gas, or the like is used. When a semiconductor layer that includes N is formed, for example, a source gas that includes N such as ammonia ($NH_3$) gas or the like is used. When a semiconductor layer that includes Al is formed, for example, a source gas that includes Al such as trimethylaluminum (TMA) gas or the like is used. When a semiconductor layer that includes In is formed, for example, a source gas that includes In such as trimethylindium (TMI) or the like is used. When a semiconductor layer that includes Si is formed, for example, a gas that includes Si such as monosilane ($SiH_4$) gas or the like is used. When a semiconductor layer that includes Mg is formed, for example, a source gas that includes Mg such as bis cyclopentadienyl magnesium ($Cp_2Mg$) gas or the like is used. The processes will now be elaborated.

First, the process 51 of forming the first light-emitting part 110 is performed.

The process S1 of forming the first light-emitting part 110 includes the process S11 of forming the foundation layer 111, the process S12 of forming the first n-type semiconductor layer 112 on the foundation layer 111, the process S13 of forming the first active layer 113 on the first n-type semiconductor layer 112 and the process S14 of forming the first p-type semiconductor layer 114 on the first active layer 113 in this order.

The process S11 of forming the foundation layer 111 to the process S13 of forming the first active layer 113 include forming the foundation layer 111, the first n-type semiconductor layer 112, and the first active layer 113 on the substrate 11 in this order by supplying the carrier gases and the source gases corresponding to each layer of the foundation layer 111, the first n-type semiconductor layer 112, and the first active layer 113 to a furnace.

As shown in FIG. 3A, the process S14 of forming the first p-type semiconductor layer 114 includes the process S14a of forming the fifth layer 114a at the fifth temperature T1a, the process S14b of forming the first layer 114b at the first temperature T1b, and the process S14c of forming the second layer 114c at the third temperature T1c in this order.

In the process S14a of forming the fifth layer 114a, the fifth layer 114a is formed on the first active layer 113. For example, the fifth layer 114a is formed by supplying, to a furnace, a carrier gas, a source gas that includes Ga, Al, and N, and a source gas that includes the p-type impurity of Mg.

Thereby, the fifth layer 114a that is made of AlGaN doped with Mg as the p-type impurity is formed on the first active layer 113. The fifth temperature T1a inside the furnace in the process S14 is not particularly limited. It is favorable for the fifth temperature T1a to be, for example, not less than 800° C. and not more than 900° C.

In the process S14b of forming the first layer 114b, the first layer 114b of the first p-type impurity concentration is formed on the fifth layer 114a. For example, the first layer 114b is formed by supplying, to a furnace, a carrier gas and a source gas that includes Ga and N but does not include a p-type impurity. In the process S14b, the first layer 114b is formed without supplying a source gas that includes a p-type impurity. Thereby, the first layer 114b that is made of undoped GaN is formed on the fifth layer 114a. It is favorable for the first temperature T1b inside the furnace in the process S14b to be greater than the fifth temperature T1a when forming the fifth layer 114a. The first temperature T1b inside the furnace in the process S14b is not particularly limited. It is favorable for the first temperature T1b to be, for example, not less than 900° C. and not more than 1050° C. The crystallinity of the first layer 114b can be improved by setting the first temperature T1b to be not less than 900° C. The thermal load on the first active layer 113 can be reduced by setting the first temperature T1b to be not more than 1050° C.

In the process S14c of forming the second layer 114c, the second layer 114c is formed on the first layer 114b with the fourth p-type impurity concentration that is greater than the first p-type impurity concentration. For example, the second layer 114c is formed by supplying, to a furnace, a carrier gas that includes nitrogen gas, a source gas that includes Ga and N, and a source gas that includes the p-type impurity of Mg. Thereby, the second layer 114c that is made of GaN doped with Mg as the p-type impurity is formed on the first layer 114b. It is favorable for the third temperature T1c inside the furnace in the process S14c to be greater than the fifth temperature T1a and less than the first temperature T1b. In other words, it is favorable that fifth temperature T1a<third temperature T1c<first temperature T1b. The third temperature T1c inside the furnace in the process S14c is not particularly limited. It is favorable for the third temperature T1c to be, for example, not less than 830° C. and not more than 980° C. By setting the third temperature T1c to be not less than 830° C., the p-type impurity of a semiconductor layer doped with Mg as the p-type impurity can be easily activated. By setting the third temperature T1c to be not more than 980° C., the diffusion of the p-type impurity included in the first p-type semiconductor layer 114 to the third layer 133b side can be reduced.

Thus, as shown in FIG. 4, the first light-emitting part 110 that includes the foundation layer 111, the first n-type semiconductor layer 112, the first active layer 113, and the first p-type semiconductor layer 114 is formed on the substrate 11.

Then, the process S2 of forming the tunnel junction part 120 is performed.

In the process S2 of forming the tunnel junction part 120, the tunnel junction part 120 is formed on the first light-emitting part 110. For example, the tunnel junction part 120 is formed by supplying, to a furnace, a carrier gas, a source gas that includes Ga and N, and a source gas that includes the n-type impurity of Si. Thereby, the tunnel junction part 120 that is made of GaN doped with Si as the n-type impurity is formed on the first light-emitting part 110. The tunnel junction part 120 may be formed by MBE (Molecular Beam Epitaxy) instead of MOCVD.

Then, the process S3 of forming the second light-emitting part 130 is performed.

As shown in FIG. 2, the process S3 of forming the second light-emitting part 130 includes the process S31 of forming the second n-type semiconductor layer 131 on the tunnel junction part 120, the process S32 of forming the second active layer 132 on the second n-type semiconductor layer 131, and the process S33 of forming the second p-type semiconductor layer 133 on the second active layer 132 in this order.

The process S31 of forming the second n-type semiconductor layer 131 to the process S32 of forming the second active layer 132 include forming the second n-type semiconductor layer 131 and the second active layer 132 on the tunnel junction part 120 in this order by supplying, to a furnace, carrier gases and source gases corresponding to each layer of the second n-type semiconductor layer 131 and the second active layer 132.

As shown in FIG. 3B, the process S33 of forming the second p-type semiconductor layer 133 includes the process S33a of forming the sixth layer 133a at the sixth temperature T2a, the process S33b of forming the third layer 133b at the second temperature T2b, and the process S33c of forming the fourth layer 133c at the fourth temperature T2c in this order.

In the process S33a of forming the sixth layer 133a, the sixth layer 133a is formed on the second active layer 132. For example, the sixth layer 133a is formed by supplying, to a furnace, a carrier gas, a source gas that includes Ga, Al, and N, and a source gas that includes the p-type impurity of Mg. Thereby, the sixth layer 133a that is made of AlGaN doped with Mg is formed on the second active layer 132. The sixth temperature T2a inside the furnace in the process S33a is, for example, substantially equal to the fifth temperature T1a when forming the fifth layer 114a.

In the process S33b of forming the third layer 133b, the third layer 133b of the third p-type impurity concentration is formed on the sixth layer 133a. For example, a carrier gas and a source gas that includes Ga and N but does not include a p-type impurity is supplied to a furnace. In the process S33b, the third layer 133b is formed without supplying a source gas that includes a p-type impurity. Thereby, the third layer 133b that is made of undoped GaN is formed on the sixth layer 133a.

If the second temperature T2b is high in the process S33b, the p-type impurity that is included in the first p-type semiconductor layer 114 easily diffuses toward the third layer 133b side. When the p-type impurity diffuses toward the third layer 133b side and diffuses into, for example, the tunnel junction part 120, the electrons that are supplied from the tunnel junction part 120 to the second light-emitting part 130 are reduced, and a forward voltage Vf of the light-emitting element 10 is increased. Conversely, according to this embodiment, the second temperature T2b is less than the first temperature T1b when forming the first layer 114b. Therefore, the diffusion of the p-type impurity doped into the first p-type semiconductor layer 114 toward the third layer 133b side can be reduced, and the p-type impurity diffusion into the tunnel junction part 120 can be reduced. As a result, the light-emitting element 10 can have a low forward voltage Vf.

On the other hand, if the second temperature T2b is low, for example, the p-type impurities that are doped into the second layer 114c, the fifth layer 114a, and the sixth layer 133a may not be sufficiently activated, and the crystallinity of the third layer 133b may be reduced. Conversely, according to this embodiment, the second temperature T2b is greater than the fifth temperature T1a when forming the fifth layer 114a and the sixth temperature T2a when forming the sixth layer 133a. Therefore, the p-type impurities of the second layer 114c, the fifth layer 114a, and the sixth layer 133a can be easily activated, and the degradation of the crystallinity of the third layer 133b can be reduced.

In summary, it is favorable that first temperature T1b>second temperature T2b>fifth temperature T1a and sixth temperature T2a. However, second temperature T2b fifth temperature T1a and sixth temperature T2a is acceptable. The second temperature T2b is not particularly limited. It is favorable for the second temperature T2b to be, for example, not less than 900° C. and not more than 980° C. By setting the second temperature T2b to be not less than 900° C., for example, the p-type impurities of the second layer 114c, the fifth layer 114a, and the sixth layer 133a can be activated, and the crystallinity of the third layer 133b can be improved. By setting the second temperature T2b to be not more than 980° C., the diffusion of the p-type impurity included in the first p-type semiconductor layer 114 toward the third layer 133b side can be reduced. It is favorable for the difference between the first temperature T1b and the second temperature T2b to be not less than 20° C. and not more than 100° C.

According to this embodiment, the third layer 133b is formed so that the film thickness d22 of the third layer 133b is greater than the film thickness d12 of the first layer 114b. There are cases in which concave pits caused by dislocations, etc., are formed in the upper surface of the sixth layer 133a. By setting the film thickness d22 of the third layer 133b to be thicker, such concave pits can be filled with the third layer 133b, and the upper surface of the third layer 133b can approach a flat surface. As a result, the crystallinity of the fourth layer 133c formed on the third layer 133b can be improved. Also, the thermal load on the semiconductor layers formed before forming the third layer 133b can be reduced.

In the process S33c of forming the fourth layer 133c, the fourth layer 133c is formed on the third layer 133b with the fourth p-type impurity concentration that is greater than the third p-type impurity concentration. For example, the fourth layer 133c is formed by supplying, to a furnace, a carrier gas, a source gas that includes Ga and N, and a source gas that includes the p-type impurity of Mg. Thereby, the fourth layer 133c that is made of GaN doped with Mg is formed on the third layer 133b. It is favorable for the fourth temperature T2c inside the furnace in the process S33c to be greater than the sixth temperature T2a when forming the sixth layer 133a and less than the second temperature T2b when forming the third layer 133b. For example, the fourth temperature T2c is substantially equal to the third temperature T1c when forming the first layer 114b.

In summary, it is favorable that fifth temperature T1a=sixth temperature T2a<temperature T1c=temperature T2c<temperature T2b<temperature T1b. However, the magnitude relationship of the temperatures T1a, T1b, T1c, T2a, T2b, and T2c is not limited to such a relationship.

Thus, as shown in FIG. 6, the second light-emitting part 130 is formed on the tunnel junction part 120.

Then, the process S4 of forming the n-side electrode 13 and the p-side electrode 14 is performed.

In the process S4 of forming the n-side electrode 13 and the p-side electrode 14, first, as shown in FIG. 7, the first and third surfaces 112s1 and 112s3 of the first n-type semiconductor layer 112 are exposed from under the tunnel junction part 120 and the second light-emitting part 130 by removing a portion of the semiconductor stacked body 12. For example, the portion of the semiconductor stacked body 12 can be removed by selective etching using a resist.

Then, the n-side electrode 13 is formed on the exposed first surface 112s1. Also, the p-side electrode 14 is formed on the fourth layer 133c of the second p-type semiconductor layer 133. For example, the n-side electrode 13 and the p-side electrode 14 can be formed by sputtering or vapor deposition.

Thus, the light-emitting element 10 can be obtained as shown in FIG. 7. However, the method for manufacturing the light-emitting element is not limited to the methods described above. For example, the method for manufacturing the light-emitting element may be performed without the process of forming the foundation layer, and the first n-type semiconductor layer may be directly formed on the substrate.

The method for manufacturing the light-emitting element 10 according to this embodiment includes the process S1 of forming the first light-emitting part 110, the process S2 of forming the tunnel junction part 120 on the first light-emitting part 110, and the process S3 of forming the second light-emitting part 130 on the tunnel junction part 120. The first light-emitting part 110 includes the first n-type semiconductor layer 112, the first active layer 113 located on the first n-type semiconductor layer 112, and the first p-type semiconductor layer 114 located on the first active layer 113. The second light-emitting part 130 includes the second n-type semiconductor layer 131, the second active layer 132 located on the second n-type semiconductor layer 131, and the second p-type semiconductor layer 133 located on the second active layer 132.

The first p-type semiconductor layer 114 includes the first layer 114b and the second layer 114c. The process S1 of forming the first light-emitting part 110 includes the process 514b of forming the first layer 114b at the first temperature T1b without supplying a source gas that includes a p-type impurity, and the process S14c of forming the second layer 114c on the first layer 114b by supplying a source gas that includes a p-type impurity.

The second p-type semiconductor layer 133 includes the third layer 133b and the fourth layer 133c. The process S3 of forming the second light-emitting part 130 includes the process S33b of forming the third layer 133b at the second temperature T2b that is less than the first temperature T1b without supplying a source gas that includes a p-type impurity, and the process S33c of forming the fourth layer 133c on the third layer 133b by supplying a source gas that includes a p-type impurity.

The diffusion of the p-type impurity of the first p-type semiconductor layer 114 mainly into the tunnel junction part 120 when forming the third layer 133b can be reduced thereby. As a result, the light-emitting element 10 can have a low forward voltage Vf. It may be considered to reduce the growth temperatures of the semiconductor layers included in the second light-emitting part 130 that is formed after the tunnel junction part 120 to reduce the diffusion of the p-type impurities into the tunnel junction part 120. In the second light-emitting part 130 according to this embodiment, the second temperature T2b of the third layer 133b that is formed without supplying a source gas that includes a p-type impurity is less than the first temperature T1b. The diffusion of the p-type impurity of the first p-type semiconductor layer 114 into the tunnel junction part 120 can be reduced thereby without greatly reducing the characteristics of the light-emitting element 10. For example, if the fourth temperature T2c of the fourth layer 133c that is formed by supplying a source gas that includes a p-type impurity is low, there is a possibility that the activation of the p-type impurity of the fourth layer 133c will not be sufficient.

It is favorable for the film thickness d22 of the third layer 133b to be greater than the film thickness d12 of the first layer 114b. Thereby, the concave pits of the upper surface of the sixth layer 133a can be filled with the third layer 133b, and the upper surface of the third layer 133b can approach a flat surface. As a result, the crystallinity of the fourth layer 133c formed on the third layer 133b can be improved. By setting the second temperature T2b to be less than the first temperature T1b, even when the film thickness d22 of the third layer 133b is thick, the thermal load on the semiconductor layers formed before forming the third layer 133b can be reduced compared to when the first temperature T1b and the second temperature T2b are the same temperature. It is favorable for the film thickness d22 of the third layer 133b to be not less than 1.5 times the film thickness d12 of the first layer 114b. When the film thickness d22 of the third layer 133b is set to be not less than 1.5 times and not more than 3 times the film thickness d12 of the first layer 114b, for example, it is favorable for the film thickness d22 of the third layer 133b to be 90 nm, and it is favorable for the film thickness d12 of the first layer 114b to be 50 nm.

The first p-type semiconductor layer 114 further includes the fifth layer 114a. The process Si of forming the first light-emitting part 110 further includes the process 514a of forming the fifth layer 114a by supplying a source gas that includes the p-type impurity before the process 514b of forming the first layer 114b. The quantity of holes injected into the first active layer 113 can be increased by providing the fifth layer 114a. The second p-type semiconductor layer 133 further includes the sixth layer 133a. The process S3 of forming the second light-emitting part 130 further includes the process S33a of forming the sixth layer 133a by supplying a source gas that includes a p-type impurity before the process S33b of forming the third layer 133b. The quantity of holes injected into the second active layer 132 can be increased by providing the sixth layer 133a.

In the process 514c of forming the second layer 114c, the second layer 114c is formed at the third temperature T1c that is less than the first temperature T1b when forming the first layer 114b and the second temperature T2b when forming the third layer 133b. Thereby, the diffusion of the p-type impurity of the fifth layer 114a toward the second layer 114c side can be reduced when forming the second layer 114c. In the process S33c of forming the fourth layer 133c, the fourth layer 133c is formed at the fourth temperature T2c that is less than the first temperature T1b when forming the second layer 114c and the second temperature T2b when forming the third layer 133b. Thereby, the diffusion of the p-type impurities of the second and fifth layers 114c and 114a into the tunnel junction part 120 can be reduced when forming the fourth layer 133c.

EXAMPLES

Examples and reference examples will now be described.

Light-emitting elements according to examples 1 to 5 and light-emitting elements according to reference examples 1 and 2 were made.

The light-emitting elements according to the examples 1 to 5 and the light-emitting elements according to the reference examples 1 and 2 each had layer structures similar to the light-emitting element 10 shown in FIG. 1. The second temperature when forming the third layer of the second p-type semiconductor layer was different between the light-emitting elements according to the examples 1 to 5 and the light-emitting elements according to the reference examples 1 and 2, and the same formation methods of the other layers of the first p-type semiconductor layer including the first layer were used.

Specifically, the first p-type semiconductor layers of the light-emitting elements according to the examples 1 to 5 and the light-emitting elements according to the reference examples 1 and 2 each included the fifth, first, and second layers similarly to the first p-type semiconductor layer 114 of FIG. 1. The second p-type semiconductor layers of the light-emitting elements according to the examples 1 to 5 and the light-emitting elements according to the reference examples 1 and 2 each included the sixth, third, and fourth layers similarly to the second p-type semiconductor layer 133 of FIG. 1.

The fifth layer and the sixth layer each were made of AlGaN doped with Mg as the p-type impurity. The fifth layer and the sixth layer each were formed by CVD by supplying a carrier gas, a source gas that included Al, Ga, and N, and a source gas that included Mg. The fifth temperature T1a when forming the fifth layer was set to 840° C. The sixth temperature T2a when forming the sixth layer was set to 840° C.

The first layer and the third layer each included GaN. The first layer and the third layer each were formed by CVD by supplying a carrier gas and a source gas that included Ga and N. A source gas that included Mg was not supplied when forming the first and third layers. The first temperature T1b when forming the first layer was set to 1000° C. The second temperature T2b when forming the third layer of the example 1 was set to 900° C. The second temperature T2b of the example 2 was set to 920° C. The second temperature T2b of the example 3 was set to 940° C. The second temperature T2b of the example 4 was set to 960° C. The second temperature T2b of the example 5 was set to 980° C. The second temperature T2b of the reference example 1 was set to the same 1000° C. as the first temperature T1b. The second temperature T2b of the reference example 2 was set to 1020° C. which was greater than the first temperature T1b.

The second layer and the fourth layer were made of GaN doped with Mg as a p-type impurity. The second layer and the fourth layer each were formed by CVD by supplying a carrier gas, a source gas that included Ga and N, and a source gas that included Mg. The third temperature T1c when forming the second layer was set to 910° C. The fourth temperature T2c when forming the fourth layer was set to 910° C.

Figure 8A:
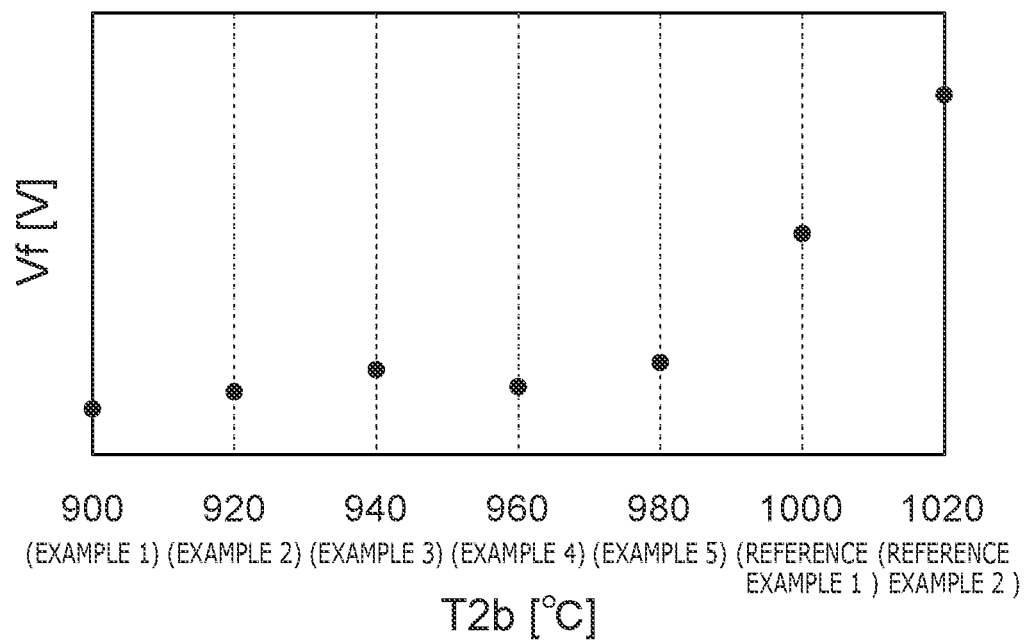
FIG. 8A is a graph showing a relationship between a second temperature and a forward voltage Vf of light-emitting elements for examples and reference examples.

FIG. 8A is a graph showing the relationship between the second temperature and the forward voltage Vf of the light-emitting element for the examples and the reference examples.

Figure 8B:
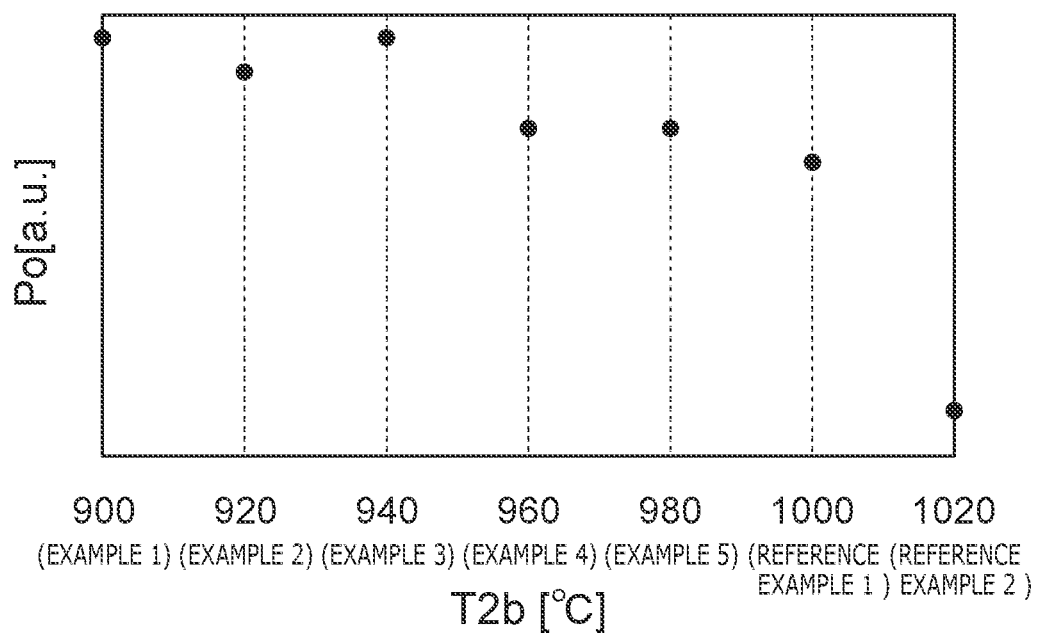
FIG. 8B is a graph showing a relationship between the second temperature and an output Po of the light-emitting elements for the examples and the reference examples.

FIG. 8B is a graph showing the relationship between the second temperature and an output Po of the light-emitting element for the examples and the reference examples.

The forward voltage Vf and the output Po were measured for each of the light-emitting elements according to the examples 1 to 5 and the light-emitting elements according to the reference examples 1 and 2 that were made. The results are shown in FIGS. 8A and 8B.

As shown in FIG. 8A, compared to the light-emitting element according to the reference example 1 in which the second temperature T2b was the same 1000° C. as the first temperature T1b, the forward voltage Vf was lower for the light-emitting elements according to the examples 1 to 5 in which the second temperature T2b was at least 20° C. less than the first temperature T1b, that is, the second temperature T2b was set to be not more than 980° C. As shown in FIG. 8B, the output Po was higher for the light-emitting elements 10 according to the examples 1 to 5 than for the light-emitting element of the reference example 1. On the other hand, as shown in FIG. 8A, compared to the light-emitting element according to the reference example 1, the forward voltage Vf was higher for the light-emitting element according to the reference example 2 in which the second temperature T2$b$ was 1020° C. which was greater than the first temperature T1$b$. As shown in FIG. 8B, the output Po of the light-emitting element according to the reference example 2 was less than that of the light-emitting element according to the reference example 1. Accordingly, it is favorable to set the second temperature T2$b$ to be less than the first temperature T1$b$, and it is more favorable for the difference between the second temperature T2$b$ and the first temperature T1$b$ to be not less than 20° C. Also, it is favorable for the second temperature T2$b$ to be not less than 900° C. and not more than 980° C.

What is claimed is:

1. A method for manufacturing a light-emitting element, the method comprising:
   forming a first light-emitting part, the first light-emitting part comprising:
      a first n-type semiconductor layer,
      a first active layer located on the first n-type semiconductor layer, and
      a first p-type semiconductor layer located on the first active layer, the first p-type semiconductor layer comprising a first layer and a second layer;
   forming a tunnel junction part on the first light-emitting part; and
   forming a second light-emitting part on the tunnel junction part, the second light-emitting part comprising:
      a second n-type semiconductor layer,
      a second active layer located on the second n-type semiconductor layer, and
      a second p-type semiconductor layer located on the second active layer, the second p-type semiconductor layer comprising a third layer and a fourth layer;
   wherein:
   the step of forming the first light-emitting part comprises:
      forming the first layer with a first p-type impurity concentration at a first temperature, and
      forming the second layer with a second p-type impurity concentration on the first layer, the second p-type impurity concentration being greater than the first p-type impurity concentration; and
   the forming of the second light-emitting part comprises:
      forming the third layer with a third p-type impurity concentration at a second temperature that is less than the first temperature, and
      forming the fourth layer with a fourth p-type impurity concentration on the third layer, the fourth p-type impurity concentration being greater than the third p-type impurity concentration.

2. The method according to claim 1, wherein:
   a film thickness of the third layer is greater than a film thickness of the first layer.

3. The method according to claim 1, wherein:
   the step of forming the first layer comprises forming the first layer without supplying a source gas including a p-type impurity;
   the step of forming the second layer comprises forming the second layer by supplying a source gas including a p-type impurity;
   the step of forming the third layer comprises forming the third layer without supplying a source gas including a p-type impurity; and
   the step of forming the fourth layer comprises forming the fourth layer by supplying a source gas including a p-type impurity.

4. The method according to claim 2, wherein:
   the step of forming the first layer comprises forming the first layer without supplying a source gas including a p-type impurity;
   the step of forming the second layer comprises forming the second layer by supplying a source gas including a p-type impurity;
   the step of forming the third layer comprises forming the third layer without supplying a source gas including a p-type impurity; and
   the step of forming the fourth layer comprises forming the fourth layer by supplying a source gas including a p-type impurity.

5. The method according to claim 1, wherein:
   the first p-type semiconductor layer further comprises a fifth layer;
   the step of forming the first light-emitting part further comprises, before the step of forming the first layer, forming the fifth layer by supplying a source gas including a p-type impurity;
   the second p-type semiconductor layer further comprises a sixth layer; and
   the step of forming the second light-emitting part further comprises, before the step of forming the third layer, forming the sixth layer by supplying a source gas including a p-type impurity.

6. The method according to claim 2, wherein:
   the first p-type semiconductor layer further comprises a fifth layer;
   the step of forming the first light-emitting part further comprises, before the step of forming the first layer, forming the fifth layer by supplying a source gas including a p-type impurity;
   the second p-type semiconductor layer further comprises a sixth layer; and
   the step of forming the second light-emitting part further comprises, before the step of forming the third layer, forming the sixth layer by supplying a source gas including a p-type impurity.

7. The method according to claim 3, wherein:
   the first p-type semiconductor layer further comprises a fifth layer;
   the step of forming the first light-emitting part further comprises, before the step of forming the first layer, forming the fifth layer by supplying a source gas including a p-type impurity;
   the second p-type semiconductor layer further comprises a sixth layer; and
   the step of forming the second light-emitting part further comprises, before the step of forming the third layer, forming the sixth layer by supplying a source gas including a p-type impurity.

8. The method according to claim 1, wherein:
   a difference between the first temperature and the second temperature is not less than 20° C. and not more than 100° C.

9. The method according to claim 2, wherein:
   a difference between the first temperature and the second temperature is not less than 20° C. and not more than 100° C.

10. The method according to claim 1, wherein:
the first temperature is not less than 900° C. and not more than 1050° C.; and
the second temperature is not less than 900° C. and not more than 980° C.

11. The method according to claim 2, wherein:
the first temperature is not less than 900° C. and not more than 1050° C.; and
the second temperature is not less than 900° C. and not more than 980° C.

12. The method according to claim 1, wherein:
the second layer is formed at a third temperature that is less than the first and second temperatures;
the fourth layer is formed at a fourth temperature that is less than the first and second temperatures.

13. The method according to claim 2, wherein:
the second layer is formed at a third temperature that is less than the first and second temperatures;
the fourth layer is formed at a fourth temperature that is less than the first and second temperatures.

14. The method according to claim 3, wherein:
the second layer is formed at a third temperature that is less than the first and second temperatures;
the fourth layer is formed at a fourth temperature that is less than the first and second temperatures.

15. The method according to claim 1, wherein:
a film thickness of the third layer is not less than 1.5 times and not more than 3 times a film thickness of the first layer.

16. The method according to claim 2, wherein:
a film thickness of the third layer is not less than 1.5 times and not more than 3 times a film thickness of the first layer.

17. The method according to claim 1, further comprising:
after the step of forming the second light-emitting part, forming a p-side electrode on the fourth layer of the second p-type semiconductor layer, and forming an n-side electrode on the first n-type semiconductor layer.

18. The method according to claim 2, further comprising:
after the step of forming the second light-emitting part, forming a p-side electrode on the fourth layer of the second p-type semiconductor layer, and forming an n-side electrode on the first n-type semiconductor layer.

* * * * *